(12) United States Patent
Turbovich et al.

(10) Patent No.: US 10,262,095 B1
(45) Date of Patent: Apr. 16, 2019

(54) CONVERSION OF REAL NUMBER MODELING CODE TO CYCLE-DRIVEN SIMULATION INTERFACE CODE FOR CIRCUIT DESIGN IN DIGITAL MIXED SIGNAL ENVIRONMENTS

(71) Applicant: Cadence Design Systems, Inc., San Jose, CA (US)

(72) Inventors: Ophir Turbovich, Haifa (IL); Yosinori Watanabe, Lafayette, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 37 days.

(21) Appl. No.: 15/718,788

(22) Filed: Sep. 28, 2017

(51) Int. Cl.
*G06F 17/50* (2006.01)
*G06F 8/41* (2018.01)

(52) U.S. Cl.
CPC ...... *G06F 17/5063* (2013.01); *G06F 17/5036* (2013.01); *G06F 8/41* (2013.01)

(58) Field of Classification Search
CPC .................................................. G06F 17/5063
USPC .......................................................... 716/102
See application file for complete search history.

(56) References Cited

U.S. PATENT DOCUMENTS

| | | | |
|---|---|---|---|
| 10,133,837 B1* | 11/2018 | Turbovich | G06F 17/5027 |
| 2011/0161066 A1* | 6/2011 | Kakkar | G06F 17/5009 703/15 |
| 2015/0128100 A1* | 5/2015 | Foisy | G01R 31/318519 716/108 |

* cited by examiner

*Primary Examiner* — Suresh Memula
(74) *Attorney, Agent, or Firm* — McDermott Will & Emery LLP

(57) ABSTRACT

A method for converting real number modeling to a cycle-driven simulation interface file is provided. The method includes verifying an input in a file that includes a real number modeling code, requesting a user input parameter, converting the file to a cycle-driven simulation interface file based on the user input parameter, and verifying the cycle-driven simulation interface file. Converting the method includes building a definitions file storing a width of at least one real number in the circuit design, and selecting a real number modeling file from the circuit design. For the real number modeling file, the method includes parsing the real number modeling file, building a header file associated with the real number modeling file, and building a compilation file associated with the cycle-driven simulation interface file. A system and a computer readable medium to perform the above method are also provided.

20 Claims, 7 Drawing Sheets

CONVERSION OF REAL NUMBER MODELING CODE TO CYCLE-DRIVEN SIMULATION INTERFACE CODE FOR CIRCUIT DESIGN IN DIGITAL MIXED SIGNAL ENVIRONMENTS

TECHNICAL FIELD

Embodiments described herein are generally related to the field of circuit emulation in circuit design applications. More specifically, embodiments described herein are related to the automatic conversion of real number modeling code to cycle-driven simulation interface code for circuit design in digital mixed signal environments.

BACKGROUND

Full chip integration tasks in modern Very Large System Integration (VLSI) commonly include integration of a digital part, an analog part, a power intent and software (SW) and are commonly performed in simulation. For the simulation, usually a real number model (RNM) of the analog part is used to increase simulation speed. In some cases the simulation speed is not fast enough to achieve the integration target, including cases like pre-silicon SW development with high interaction between the SW and the analog part, or cases like long algorithms that involve digital design (with or without SW) and analog design. The standard solution to accelerate simulation speed in these cases is to run on an emulator. However, emulators typically run synthesizable code only. Therefore, some approaches include manual conversion of analog emulation tools into synthesizable code compatible with digital emulation tools. These manual techniques are time consuming (up to several days or even weeks to complete a system level emulation), subjective, inaccurate, and difficult to generalize and re-use for different circuit configurations.

The description provided in the background section should not be assumed to be prior art merely because it is mentioned in or associated with the background section. The background section may include information that describes one or more aspects of the subject technology.

SUMMARY

In certain aspects, a method for converting real number modeling to a cycle-driven simulation interface file is described. The method includes verifying an input in a file that includes a real number modeling code for a circuit design, requesting a user input parameter, converting the file to a cycle-driven simulation interface file based on the user input parameter, and verifying the cycle-driven simulation interface file. In some embodiments, converting the file to a cycle-driven simulation interface file includes building a definitions file storing a width of at least one real number in the circuit design, and selecting a real number modeling file from the circuit design. For the real number modeling file, the method includes parsing the real number modeling file, building a header file associated with the real number modeling file, and building a compilation file associated with the cycle-driven simulation interface file.

In certain aspects, a system for converting real number modeling to a cycle-driven simulation interface file is described. The system includes a memory storing computer code, and at least one processor that executes the computer code to verify an input in a file that includes a real number modeling code for a circuit design. The processor also executes the computer code to request a user input parameter and to convert the file to a cycle-driven simulation interface file based on the user input parameter, including converting a time delay in the file into an interval having a predetermined number of clock cycles, and to verify the cycle-driven simulation interface file. To convert the file to a cycle-driven simulation interface file, the processor executes the computer code to build a definitions file storing a width of at least one real number in the circuit design, and to select a real number modeling file from the circuit design. For the real number modeling file, the processor executes the computer code to parse the real number modeling file, build a header file associated with the real number modeling file, and build a compilation file associated with the cycle-driven simulation interface file.

In certain aspects, a non-transitory, machine-readable storage medium is described that includes machine-readable instructions for causing a processor to execute a method. The method includes verifying an input in a file that includes a real number modeling code for a circuit design, requesting a user input parameter, and converting the file to a cycle-driven simulation interface file based on the user input parameter. The method includes converting a time delay in the file into an interval having a predetermined number of clock cycles and verifying that a signal in a sensitivity list for a process block in the cycle-driven simulation interface file is driven by a valid clock input. The method may also include verifying the cycle-driven simulation interface file. In some embodiments, converting the file to a cycle-driven simulation interface file includes building a definitions file storing a width of at least one real number in the circuit design, and selecting a real number modeling file from the circuit design. For the real number modeling file, the method includes parsing the real number modeling file, building a header file associated with the real number modeling file, and building a compilation file associated with the cycle-driven simulation interface file.

In certain aspects, a system is described including a means for storing computer code. The system further includes a means to execute the computer code for verifying an input in a file that includes a real number modeling code for a circuit design, for requesting a user input parameter, for converting the file to a cycle-driven simulation interface file based on the user input parameter, and for verifying the cycle-driven simulation interface file. In some embodiments, the means to execute the computer code is configured for converting the file to a cycle-driven simulation interface file by building a definitions file storing a width of at least one real number in the circuit design, and by selecting a real number modeling file from the circuit design. For the real number modeling file, the means to execute the computer code is configured for parsing the real number modeling file, for building a header file associated with the real number modeling file, and for building a compilation file associated with the cycle-driven simulation interface file.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

Figure 1:
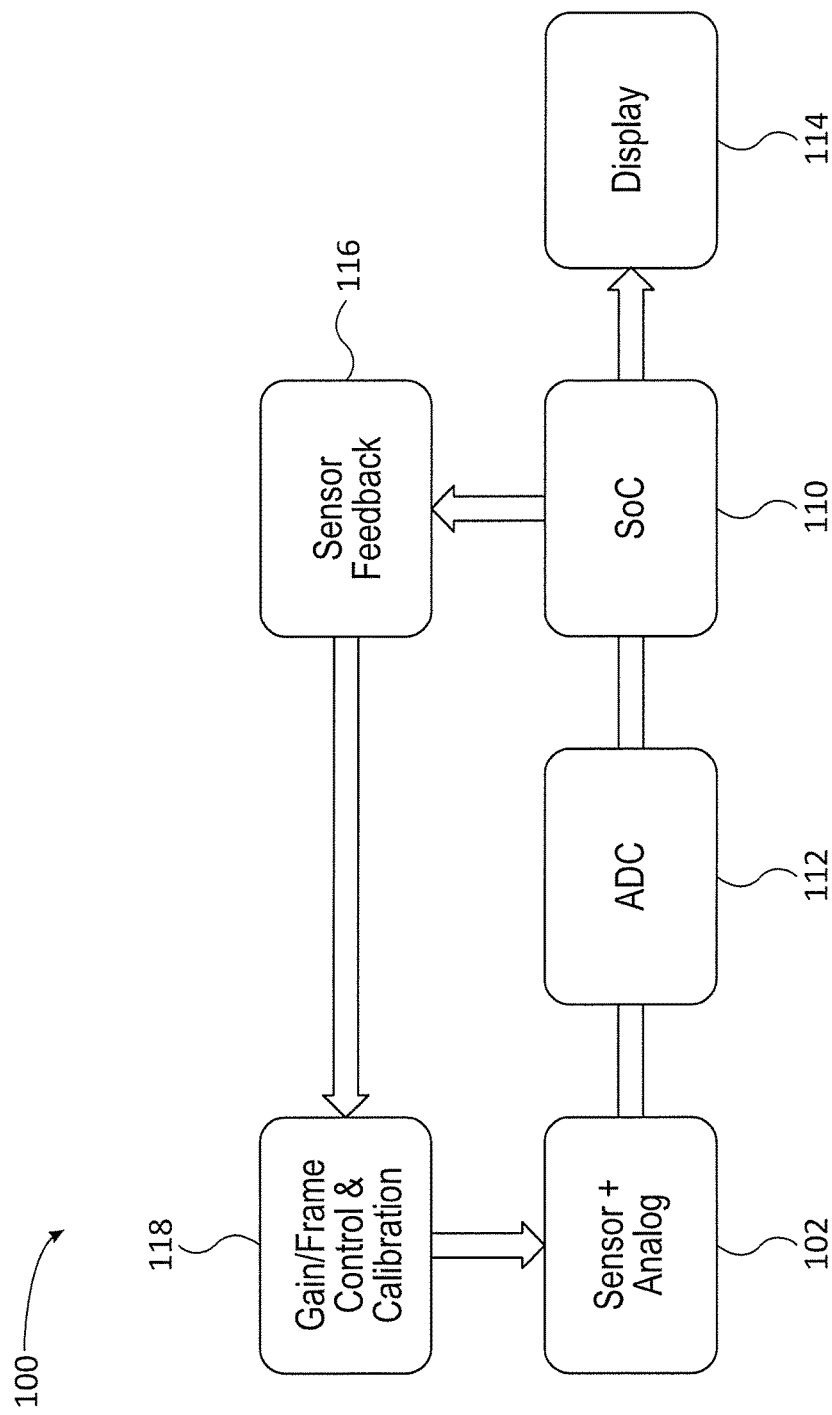
FIG. 1 illustrates a digital mixed signal (DMS) environment including analog and digital components emulated according to some embodiments.

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides a method for converting real number modeling to cycle-driven simulation interface code for circuit design. More specifically, embodiments as disclosed herein may be used in emulation tools for integrated circuits in digital mixed signal environments.

The disclosed system addresses a technical problem tied to computer technology and arising in the realm of computer simulation of hardware, namely the technical problem of automatically converting a RNM code to a cycle-based simulation interface code for use with faster digital simulation tools. The disclosed system solves this technical problem by requesting user input parameters to automatically associate process blocks to a clock and automatically convert floating point to fixed point signals, thus allowing a digital simulation interface to incorporate analog logic into an efficient system simulation with reduced user intervention.

Current electronic circuitry typically involves a plurality of integrated circuits forming an interactive system. For circuit manufacturing, it is desirable to perform software verification steps once a circuit design is completed and before a tape-out of the circuit design is provided for manufacture. The verification steps are carried out by emulation tools that test the performance of the circuit design under different circumstances. System level verification in a DMS environment requires the combination of elements such as: analog design, digital design, power intent, and embedded software (SW). Traditional emulation tools for analog design use real number modeling (RNM) code, which typically runs at a much slower rate than emulation tools for digital design (e.g., using Verilog code). For example, some analog verification tools running RNM code may complete iteration cycles at a rate of several kilo-Hertz ($\sim 10^3$ iterations per second), while emulation tools for digital circuits may complete iteration cycles at a rate of several mega-Hertz ($\sim 10^6$ iterations per second). It is desirable to have an emulation tool that provides efficient computation in many scenarios of a DMS environment (like SW development, long algorithm, long scenarios, and the like). Accordingly, the bottleneck for a true system level, DMS environment emulation is the handling of analog components in the design. More specifically, it is desirable to have a system and a method to convert RNM code into cycle-driven simulation interface code that can be used in digital simulation tools.

Embodiments as disclosed herein convert real number modeling code to cycle-driven simulation interface code to obtain an emulation tool in a DMS environment for integrated circuits. More generally, conversion of real number modeling code to cycle-driven simulation interface code may be desirable in real-time hardware simulation applications. Such applications may include feedback control electronics and robotic mechanisms, among others.

Some of the challenges faced in converting RNM code to cycle-driven simulation interface applications include translating event-driven processes in RNM code to cycle-driven processes (e.g., in system-C code). RNM is event driven, behavioral code, while in cycle-driven code events are tied to a clock signal. In some embodiments, converting RNM code to cycle-driven simulation interface code includes a floating point to fix point conversion step, to handle a limited bit width of the signals used in the cycle-driven code.

In some embodiments, such a cycle-driven simulation interface may include a system-C file. System-C is an extension of the C++ language that allows the user to control signal timing and device ports. The cycle-driven simulation interface converts RNM processes taking into account the time it takes to complete each operation. The time is accounted for in clock cycles. Emulation tools consistent with the present disclosure may include a high level synthesis tool (HLS) that further converts a cycle-driven simulation interface file to synthesizable RTL files (e.g., in Verilog RTL code). Synthesizable RTL files include standard logic cells like flip-flops and other standard cells ('OR,' 'NOT,' 'AND,' 'NOR,' 'NAND') used in Boolean logic calculations to be performed at a gate level in a digital circuit under a pre-determined number of clock cycles (at least one). Thus, embodiments as disclosed herein incorporate analog emulation into digital emulation tools at speeds several orders of magnitude faster than traditional analog verification tools.

Example System Architecture

FIG. 1 illustrates a DMS environment 100 including analog and digital components emulated according to some embodiments. The circuit design in DMS environment 100 may represent, for example, a digital camera having sensors to adjust various optical settings (e.g., focal length, aperture size, and the like) based on the quality of the image displayed on a flat panel. While the sensor may be an analog device, the image quality may be obtained by a digital processor in the camera. Accordingly, analog components in DMS environment 100 may include a sensor 102 and digital components may include a system on a chip (SoC) 110, coupled to sensor 102 through analog to digital converter (ADC) 112. SoC 110 may provide a digital input signal to a display 114, and a signal to a sensor feedback block 116. Sensor feedback block 116 may be coupled to a gain/frame control and calibration block 118 that provides a control signal to sensor 102. In some embodiments, display 114, sensor feedback block 116, and gain/frame control and calibration block 118 include digital circuitry.

Current electronic circuit design may include embedded software (SW) commands in SoC 112, which may be able to adjust the configuration of the analog components (e.g., of sensor 102) dynamically. Accordingly, emulation tools as disclosed herein fully incorporate digital and analog components to test the behavior of a circuit in DMS environment 100.

Figure 2:
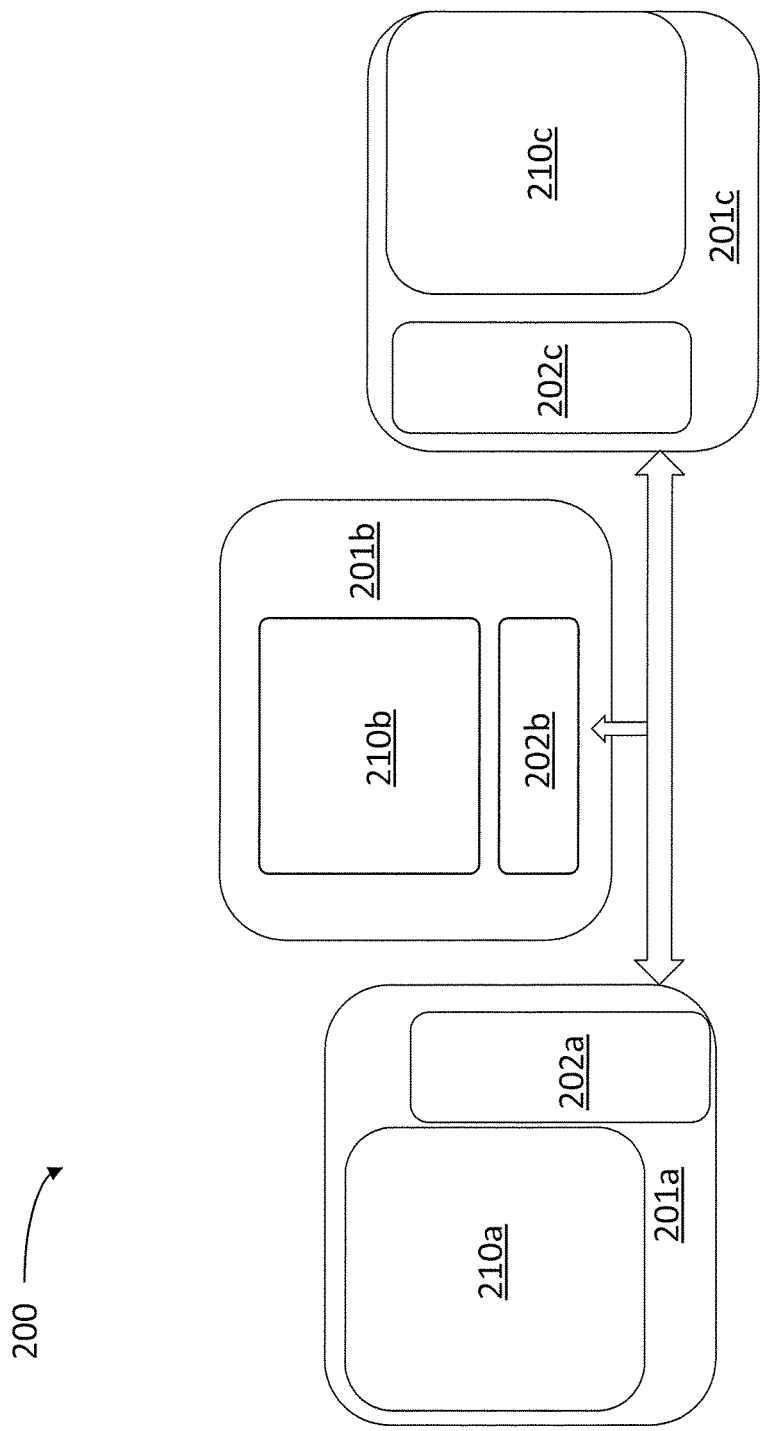
FIG. 2 illustrates a DMS environment including a plurality of integrated circuits emulated according to some embodiments.

FIG. 2 illustrates a DMS environment 200 including a plurality of integrated circuits 201a, 201b and 201c (hereinafter collectively referred to as integrated circuits 201) emulated according to some embodiments. The circuit design in DMS environment 200 may represent, without limitation, a BLUETOOTH system where each of integrated circuits 201a, 201b and 201c is a BLUETOOTH device configured to communicate with each other according to a pre-defined protocol. In some embodiments, integrated circuits 201 may include medical device components such as physiological sensors and DMS environment 200 may be configured to regulate a drug administration to a patient based on sensor measurements, or provide an alert. Integrated circuits 201 may include digital components 210a, 210b, and 210c (collectively referred to hereinafter as digital components 210), and analog components 202a, 202b and 202c (collectively referred to hereinafter as analog components 202).

Analog components 202 may include components of a wireless transceiver, such as an RF antenna and the like. Accordingly, digital components 210 may be configured to process the signals received and transmitted through the RF antennas according to the pre-defined protocol (e.g., BLUETOOTH). Therefore, in some embodiments it is relevant to emulate the operation of each one of integrated circuits 201 at the system level, including the effect of the signaling and communication between them, such as the analog interconnection between the RF antennas in DMS environment 200. Embodiments as disclosed herein are able to provide such system level DMS emulation due to the high computation efficiency achieved by the emulation tool.

Figure 3:
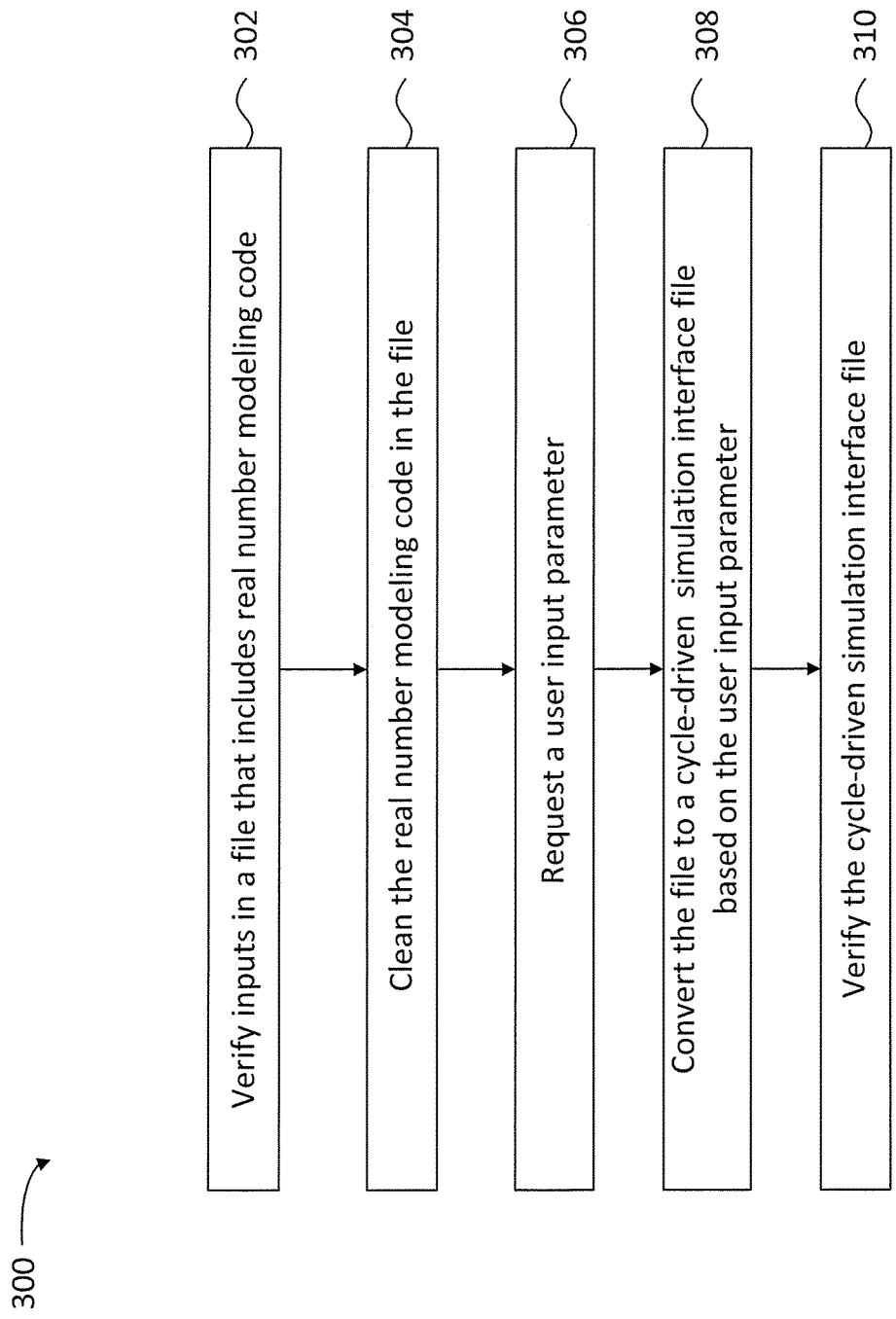
FIG. 3 is a flow chart illustrating steps in a method for converting real number modeling (RNM) to a cycle-driven simulation interface file, according to some embodiments.

FIG. 3 is a flow chart illustrating steps in a method 300 for converting a real number modeling (RNM) file to a cycle-driven simulation interface file, according to some embodiments. At least some of the steps in method 300 may be performed by a computer having a processor executing commands stored in a memory of the computer. Further, steps as disclosed in method 300 may include retrieving, editing, and/or storing files in a database that is part of, or is communicably coupled to, the computer. Methods consistent with the present disclosure may include at least some, but not all of the steps illustrated in method 300, performed in a different sequence. Furthermore, methods consistent with the present disclosure may include at least two or more steps as in method 300 performed overlapping in time, or almost simultaneously.

Step 302 includes verifying inputs in a file that includes RNM code. In some embodiments, step 302 includes ensuring that the inputs for the emulation tool are acceptable and that the emulation tool may be activated. In some embodiments, step 302 includes verifying that the original design can be compiled, and that the top level design provided is correct. In some embodiments, step 302 further comprises verifying that a sample clock is available, for example, as an input file from the user.

Step 304 includes cleaning the RNM code in the file. In some embodiments, step 304 includes building a clean file in a working directory and ensuring that subsequent steps in method 300 will be free from dependencies on other files from a database hierarchy while working on a specific file. In some embodiments, step 304 may include identifying in the RNM code a loop having a non-deterministic iteration (event-based logic) or a variable time delay having an arbitrary time period (i.e., different from a clock 'edge').

Step 306 includes requesting a user input parameter for the conversion of the RNM file to the cycle-driven simulation interface file. In some embodiments, step 306 includes requesting a sample clock frequency from the user. It is desirable that the sample clock frequency be high enough to capture analog signal details without jitter or other parasitic effects. It is also desirable that the clock frequency not be too high, thus ensuring a manageable computational speed of the simulation interface. For example, in some embodiments step 306 may include selecting a clock frequency that is about twice the frequency of the analog signal (e.g., 2.2x or faster). In some embodiments, the sample clock is selected to be much faster than the analog clock (10x, or 100x, or even faster) in order to increase timing accuracy and suppress jitter.

In some embodiments, step 306 may also include requesting from the user a bit width for handling real numbers in the cycle-driven simulation interface. The bit width provided by the user in step 306 determines the accuracy of the simulation interface to capture the detailed behavior of the RNM. Also, the bit width provided by the user in step 306 influences the computational speed of the simulation interface. Accordingly, a larger bit width increases the accuracy of the simulation interface and the number of clock cycles to complete an operation. Thus, a larger bit width reduces the computational speed for a given clock frequency. Likewise, a higher clock frequency increases the number of computation cycles, thus reducing the computational speed.

In some embodiments, the accuracy of the simulation interface may be set to a 50% of the RNM accuracy. In some embodiments, a simulation interface may not tolerate such low accuracy. Accordingly, a higher accuracy such as 75%, 90%, 95% of the RNM accuracy (or even higher), may be desirable for more stringent circuit design specifications. Step 306 may include providing the user an estimate of the computational accuracy, computational speed, and timing accuracy of the resulting simulation interface based on the input parameters provided. Further, in some embodiments step 306 may include providing a pre-selected user input parameter to the user, and verifying whether the user accepts, rejects, or modifies the pre-selected user input parameter.

Step 308 includes converting the file to a cycle-driven simulation interface file. For example, when the cycle-driven simulation interface file uses system-C code, for each file to be converted there will be a header and a context file. While the header file may include constructor and function definitions, the context file may include the context for the functions. Typically, RNM code is written as behavioral code (e.g., Verilog-AMS). Accordingly, RNM code may allow more than one driver to the same signal, and combine blocking/non-blocking code in the same file. In some embodiments, RNM code is event driven, while RTL emulation desirably uses cycle driven code. Accordingly, step 308 may include tying events in the RNM code to the sample clock (either the 'rising edge' or the 'falling edge') so that the cycle-driven simulation interface uses clock counters to time out logic loops. In that regard, step 308 may include selecting a sample clock frequency that is sufficient to capture the analog signal details without jitter or other parasitic effects, and to maintain a desirable computational speed of the emulation tool. For example, in some embodiments step 308 may include selecting a clock frequency that is about twice the frequency of the analog signal (e.g., 2.2x or faster). In some embodiments, the sample clock is selected to be much faster than the analog clock (10×, or 100×, or even faster) in order to increase accuracy and suppress jitter. The clock frequency selection in step 308 may be performed as a manual user input. Further, in some embodiments step 308 may include creating a conversion table to handle variable delay occurrences in the RNM code.

In some embodiments, step 308 includes converting floating point values (fp) in the RNM file to fix point values according to a pre-selected mapping involving a sign (S), a mantissa (M), and an exponent (E). The pre-selected mapping may be of the form:

$$f_p = (-1)^S \cdot 2^{(E-2^{\#bits(E)-1}+1)}(1.M) \quad (1)$$

The number of bits of the mantissa, M, and the exponent, E, may be selected from the user input parameters. Moreover, in some embodiments step 308 may include providing the user with guidance to select a number of bits for both the floating point to fixed point conversion, and for the sample clock frequency based on both emulation accuracy and computation speed. More generally, the ranges of values for a fixed point signal (fp) as described in Eq. 1 may vary according to the specific use of the circuit design. In some embodiments, and without limitation, fp reaches voltage levels between nano-Volts (nV) to Volts, or micro-Volts (μV) to Volts. Accordingly, the number of bits for M and E are selected appropriately to reach a desired accuracy given the application requirement.

Step 310 includes verifying the cycle-driven simulation interface file. In some embodiments, step 310 includes verifying that the cycle-driven simulation interface file may be compiled appropriately. In some embodiments, step 310 includes fixing a detected compilation error, when it occurs.

Figure 4:
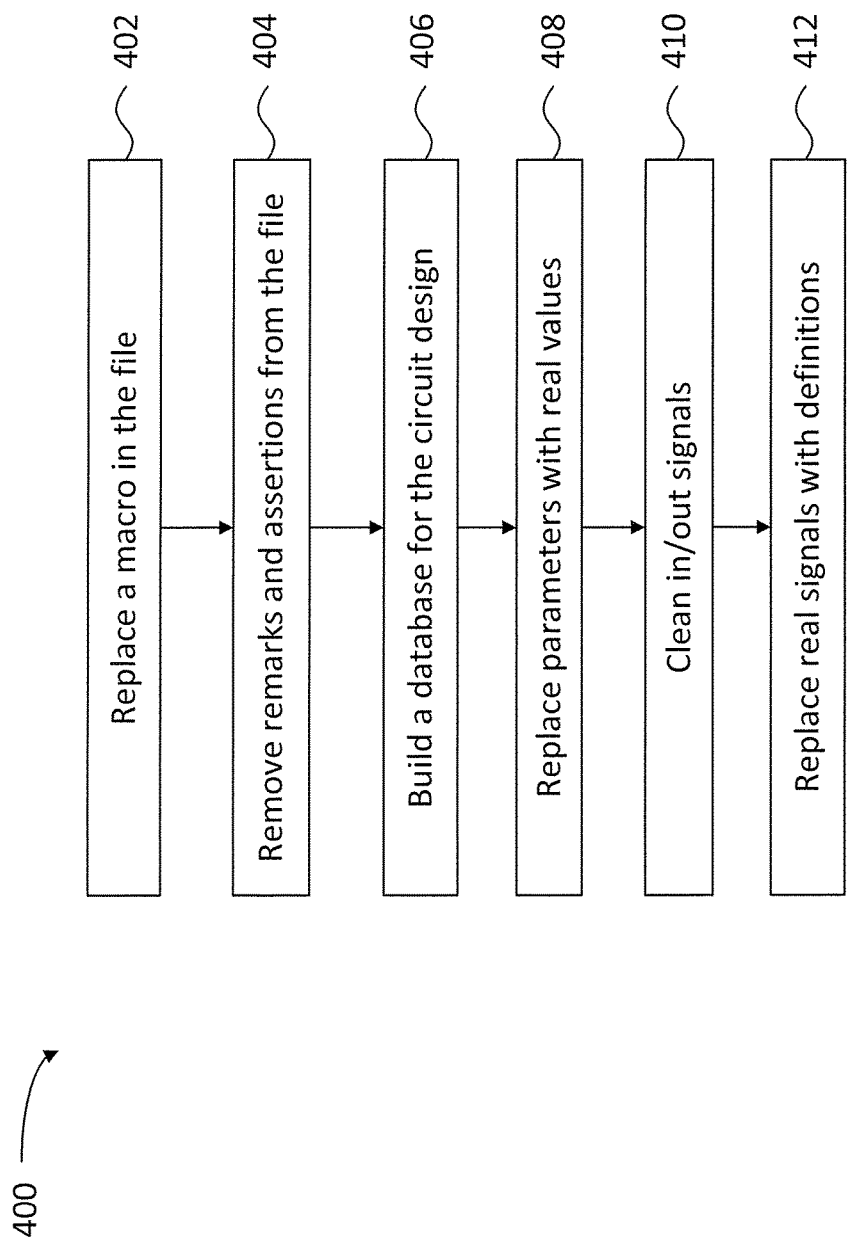
FIG. 4 is a flow chart illustrating steps in a method for cleaning RNM code in a file before converting the file to a cycle-driven simulation interface file, according to some embodiments.

FIG. 4 is a flow chart illustrating steps in a method 400 for cleaning RNM code in a file before converting the file to a cycle-driven simulation interface file, according to some embodiments. In some embodiments, at least some of the steps in method 400 may be performed within step 304 of method 300. Accordingly, the file in method 400 may be a file used in an emulation tool for analog circuit modeling coded in Verilog-AMS language. At least some of the steps in method 400 may be performed by a computer having a processor executing commands stored in a memory of the computer. Further, steps as disclosed in method 400 may include retrieving, editing, and/or storing files in a database that is part of, or is communicably coupled to, the computer. Methods consistent with the present disclosure may include at least some, but not all of the steps illustrated in method 400, performed in a different sequence. Furthermore, methods consistent with the present disclosure may include at least two or more steps as in method 400 performed overlapping in time, or almost simultaneously.

Step 402 includes replacing at least one macro in the file. In some embodiments, step 402 includes replacing each macro that exists in the file with the actual value of a signal or variable associated with the macro, thus removing dependencies outside of a database hierarchy.

Step 404 includes removing from the file any code that is not relevant for the conversion, such as remarks and assertions, or Verilog specify.

Step 406 includes building a database for the circuit design in the DMS environment. In some embodiments, step 406 includes building a top level to bottom level database hierarchy for the circuit design. The database may include modules having port connections to establish data links between modules.

Step 408 includes replacing parameters with real values. In some embodiments, step 308 includes removing dependencies between circuit design variables, thus allowing standalone execution of the file within the database hierarchy.

Step 410 includes cleaning in/out signals. In some embodiments, step 410 includes verifying that in/out signals are driven within the circuit design. When an in/out signal is driven from an element that is not in the circuit design, step 410 includes converting the in/out signal into an input signal. When the in/out signal is driven from elements included in the circuit design, step 410 includes separating the in/out signal into an input signal and an output signal to handle independently of each other.

Step 412 includes replacing real signals with definitions. Based on the database and the user inputs, step 412 includes replacing each real signal definition with a macro that indicates the number of bits to be used in the mantissa and exponent (cf. Eq. 1). Further, in some embodiments step 412 includes specifying the number of bits used as a width for either of the mantissa and the exponent of each signal definition.

Figure 5:
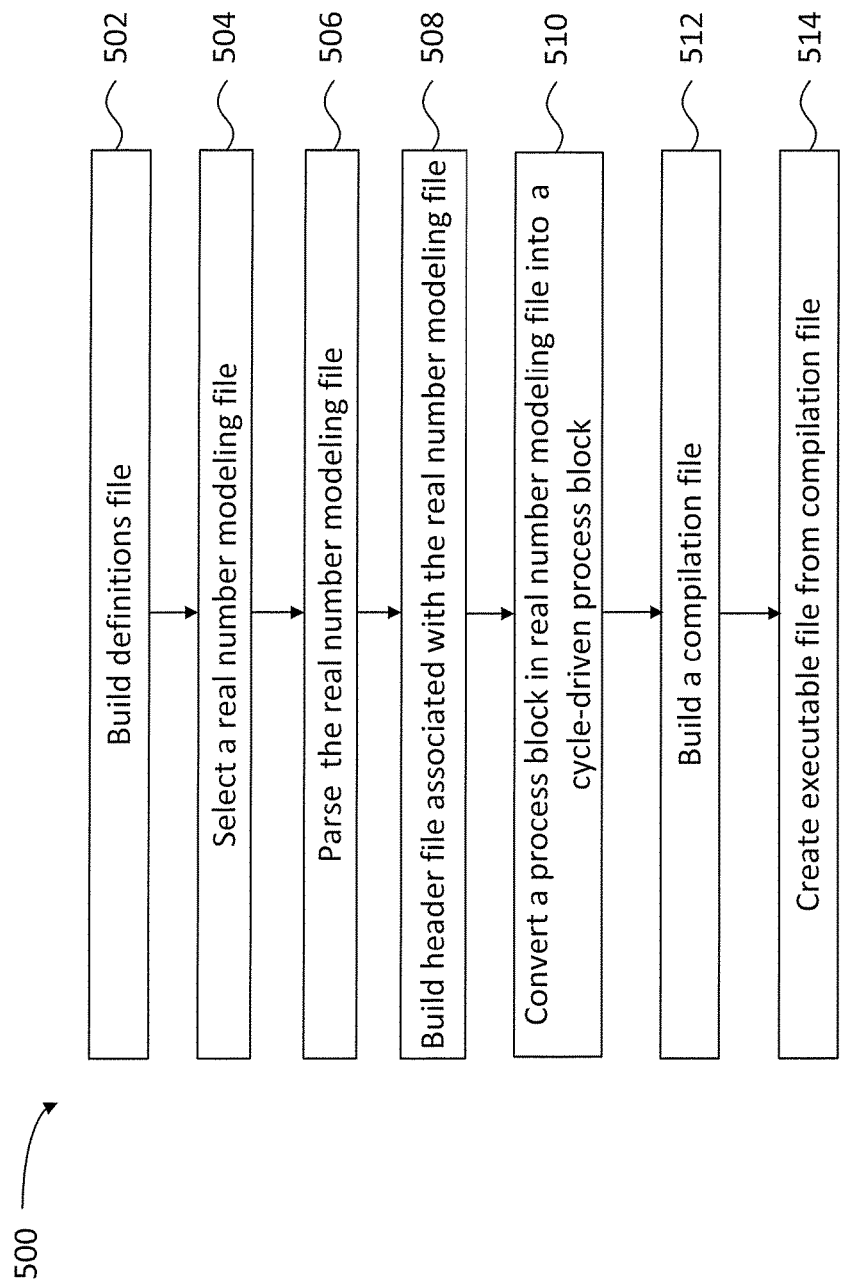
FIG. 5 is a flow chart illustrating steps in a method for converting a file including RNM code to a cycle-driven simulation interface file, according to some embodiments.

FIG. 5 is a flow chart illustrating steps in a method 500 for converting a file including clean RNM code into a cycle-driven simulation interface file, according to some embodiments. In some embodiments, at least some of the steps in method 500 may be performed within step 308 of method 300. At least some of the steps in method 500 may be performed by a computer having a processor executing commands stored in a memory of the computer. Further, steps as disclosed in method 500 may include retrieving, editing, and/or storing files in a database that is part of, or is communicably coupled to, the computer. Methods consistent with the present disclosure may include at least some, but not all of the steps illustrated in method 500, performed in a different sequence. Furthermore, methods consistent with the present disclosure may include at least two or more steps as in method 500 performed overlapping in time, or almost simultaneously.

Step 502 includes building a definitions file. Step 502 may include retrieving the definitions created in step 412 of method 400. Further, in some embodiments step 502 includes transferring the definitions down the database hierarchy and assigning to real and to wreal variables in each leaf of the database hierarchy a selected width for the mantissa and exponent (cf. Eq. 1).

Step 504 includes selecting a RNM file from the database hierarchy. In some embodiments, step 504 may include selecting the RNM file from a lower leaf in the database hierarchy, after a RNM file in the current leaf of the hierarchy has been converted. Step 506 includes parsing the RNM file and finding the 'always' blocks and assignment commands inside a Verilog file. Step 506 may include verifying that there is no more than one driver per signal. In some embodiments, step 506 may include issuing an error message and stopping execution of the tool when there is more than one driver for at least one signal. Further, in some embodiments step 506 may include merging at least some of the 'always' blocks found. Step 506 may further include calculating expected signal delays, and building a shift register from the clock having enough length to handle the expected delays during execution. The signal delays are calculated in terms of clock cycles counted as per any one of the raising edge or the falling edge of the clock signal. In some embodiments, step 506 includes building a list of all signals that are outputs from the assignments.

Step 508 includes building a header file associated with the real number modeling file. Step 508 may also include building a constructor (special type of subroutine, usually defined as part a class, called to create an object) In some embodiments, step 508 includes building a hierarchy of connections based on the database hierarchy. Files in cycle-driven simulation interfaces enable execution concurrency of process blocks to simulate real-time hardware operation. Some embodiments include two categories of process blocks, namely 'sc_thread' process blocks, and 'sc_method' process blocks (e.g., in system-C). For example, step 508 may include associating combinational assignments (not a time consuming) in the RNM file with 'sc_method' process blocks (system-C) in the header file. Step 508 may further include associating continuous assignments (e.g., a latch) in the RNM file with 'sc_thread' process blocks (system-C) in the header file. Sc_thread process blocks are executed once throughout a simulation cycle (a run of the entire circuit simulation), and can be halted at any moment and any number of times during execution of the process block. Accordingly, in 'sc_thread' process blocks may allow suspensions (e.g., by including a 'wait' command) during their execution. Sc_method process blocks are executed more than once throughout the simulation session. In some embodiments, 'sc_method' process blocks may not allow suspensions during their execution. Sc_method processes are set to start again once their execution is completed.

Step 508 may include inserting declarations for input and output signals and variables, including event objects, ports, and channels, in the header file. In some embodiments, step 508 includes listing sub-hierarchies for the file according to a database hierarchy. Step 508 includes removing assertions and checks (e.g., timing checks), and replacing parameters by the real numbers. For example, sometimes conversion files may include files for a two-bit multiplexer ('mux'), a four-bit mux, or an eight-bit mux, but only the two-bit mux may be necessary. Accordingly, the four-bit mux and the eight-bit mux files are left alone, unconverted. Step 508 may include verifying that signal outputs from sc_method blocks and sc_thread blocks are included in process blocks for leafs below the current leaf in the database hierarchy.

Step 508 may also include creating a sensitivity list to control execution of each process block. Accordingly, step 508 may include adding a plurality of variables in the sensitivity list, each variable associated with a trigger, so that the process block is executed when at least one of the variable in the sensitivity list is altered. For example, step 508 may include associating a trigger to a variable in the sensitivity list, the trigger including at least one of a positive edge, a negative edge, or a level for each of the variables. In some embodiments, step 508 may include associating a process block in the header file with a sc_thread process block when a trigger occurs on the rising edge only, or on the falling edge only, of a signal in the sensitivity list, and assigning a clock input to the signal. And when the trigger occurs on either the rising edge or the falling edge of the signal in the sensitivity list, then the process block (e.g., a combinatorial process block) is associated with a sc_method.

In some embodiments, step 508 may include defining a clock input to each variable in the sensitivity list for the process block. Moreover, in some embodiments step 508 includes adding a clock input to all process blocks in the RNM file. Step 508 may include selecting a clock sampling rate that is at least 2×, 3×, or 4× of the rate corresponding to a desired analog resolution.

Step 510 includes converting process blocks in the real number modeling file into cycle-driven process blocks. Further, step 510 includes converting at least one continuous assignment block into a sc_method process block (in sys-tem-C language), and converting at least one always block into a sc_thread process block (in system-C language) that includes a 'while' loop and a 'wait' command.

Step 512 includes building a compilation file. In some embodiments, step 512 includes building a CPP file ready for C++ compilation on a Windows-based operating system (system-C language). Step 514 includes creating an executable file from the compilation file. Accordingly, step 514 includes processing the compilation file with a compiler (e.g., a C++ compiler, and the like).

Figure 6:
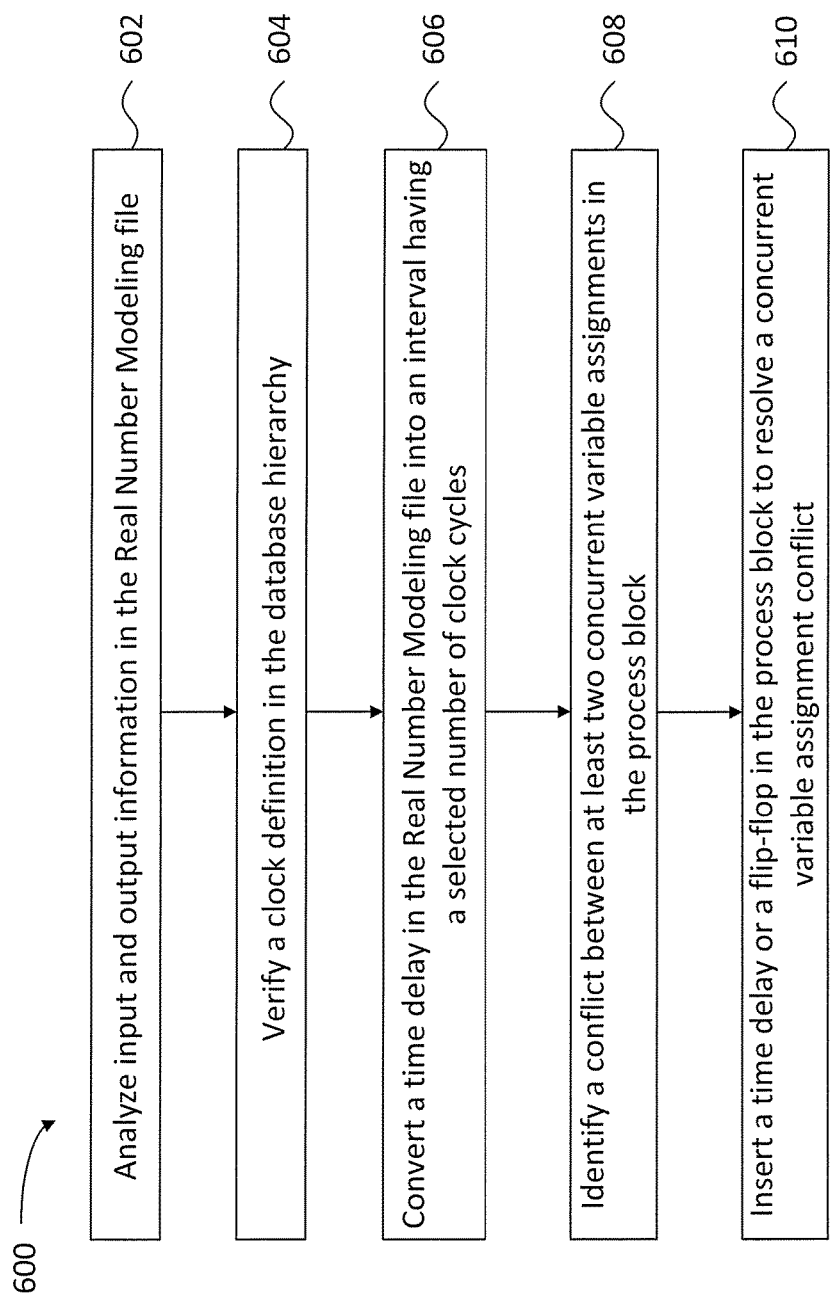
FIG. 6 is a flow chart illustrating steps in a method for converting a process block in a RNM file into a cycle-driven process block, according to some embodiments.

FIG. 6 is a flow chart illustrating steps in a method 600 for converting a process block in a RNM file into a cycle-driven process block, according to some embodiments. In some embodiments, at least some of the steps in method 600 may be performed within step 510 of method 500. At least some of the steps in method 600 may be performed by a computer having a processor executing commands stored in a memory of the computer. Further, steps as disclosed in method 600 may include retrieving, editing, and/or storing files in a database that is part of, or is communicably coupled to, the computer. Methods consistent with the present disclosure may include at least some, but not all of the steps illustrated in method 600, performed in a different sequence. Furthermore, methods consistent with the present disclosure may include at least two or more steps as in method 600 performed overlapping in time, or almost simultaneously.

Step 602 includes analyzing input and output information in the RNM file. In some embodiments, step 602 includes inspecting the process block in the RNM file to identify an 'always' command, or a continuous assignment.

Step 604 includes verifying a clock definition in the database hierarchy. When a clock definition is found in the same leaf or in a lower leaf in the database hierarchy, step 604 further includes transferring the clock definition to a process block in a leaf at least one level above the current leaf. In some embodiments, step 604 includes creating a sub-level beneath the current leaf in the database hierarchy and including the process block that uses the clock as an input in the sub-level leaf, when the clock is defined in the current leaf.

In some embodiments, step 604 may include verifying that signals in the corresponding sensitivity lists for 'continuous assignment' blocks or 'always' blocks are driven by valid clock inputs, according to the clock definition in the database history.

Step 606 includes converting a time delay in the RNM file into an interval having a selected number of clock cycles. Accordingly, step 606 may include selecting the number of clock cycles by dividing the time delay in the RNM file by the clock period.

Step 608 includes identifying a conflict between at least two concurrent variable assignments in the process block. Step 608 includes identifying, in the process block, parallel sequences of the type:

$$A = B;$$
$$C = A( = B?);$$

Wherein the value of C may be indeterminate, or depend on the order in which the above two commands are executed.

Step 610 includes inserting a time delay (by a selected number of clock cycles) or a flip-flop in the process block to resolve a concurrent variable assignment conflict. When the process block is a 'While' loop, step 610 includes inserting a latch in the 'while' loop, thus breaking up the loop into an input portion and an output portion, each portion including deterministic assignments to all variables.

Hardware Overview

Figure 7:
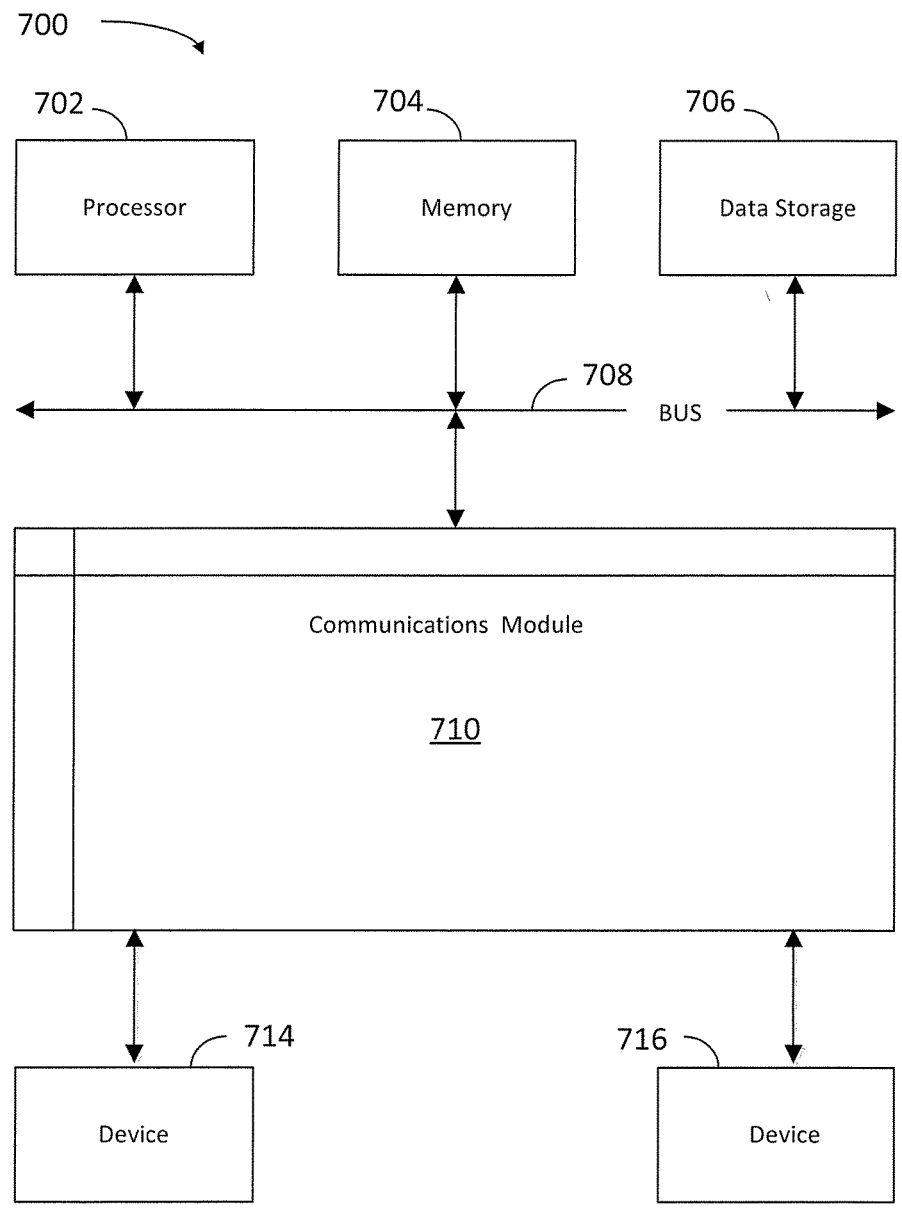
FIG. 7 is a block diagram illustrating an example computer system for converting a file including RNM code into a cycle-driven simulation interface, according to some embodiments.

FIG. 7 is a block diagram illustrating an example computer system 700 with which the methods and steps illustrated in methods 300, 400, 500 and 600 can be implemented, according to some embodiments. In certain aspects, computer system 700 can be implemented using hardware or a combination of software and hardware, either in a dedicated server, integrated into another entity, or distributed across multiple entities.

Computer system 700 includes a bus 708 or other communication mechanism for communicating information, and a processor 702 coupled with bus 708 for processing information. By way of example, computer system 700 can be implemented with one or more processors 702. Processor 702 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 702 may include modules and circuits configured as a 'placing' tool or engine, or a 'routing' tool or engine, to place devices and route channels in a circuit layout, respectively and as disclosed herein.

Computer system 700 includes, in addition to hardware, code that creates an execution environment for the computer program in question, e.g., code that constitutes processor firmware, a protocol stack, a database management system, an operating system, or a combination of one or more of them stored in an included memory 704, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 708 for storing information and instructions to be executed by processor 702. Processor 702 and memory 704 can be supplemented by, or incorporated in, special purpose logic circuitry.

The instructions may be stored in memory 704 and implemented in one or more computer program products, i.e., one or more modules of computer program instructions encoded on a computer readable medium for execution by, or to control the operation of, the computer system 700, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 704 may also be used for storing temporary variable or other intermediate information during execution of instructions to be executed by processor 702.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 700 further includes a data storage device 706 such as a magnetic disk or optical disk, coupled to bus 708 for storing information and instructions.

Computer system 700 is coupled via input/output module 710 to various devices. The input/output module 710 is any input/output module. Example input/output modules 710 include data ports such as USB ports. The input/output module 710 is configured to connect to a communications module 712. Example communications modules 712 include networking interface cards, such as Ethernet cards and modems. In certain aspects, the input/output module 710 is configured to connect to a plurality of devices, such as an input device 714 and/or an output device 716. Example input devices 714 include a keyboard and a pointing device, e.g., a mouse or a trackball, by which a user can provide input to the computer system 700. Other kinds of input devices 714 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 716 include display devices, such as a LED (light emitting diode), CRT (cathode ray tube), or LCD (liquid crystal display) screen, for displaying information to the user.

Methods as disclosed herein may be performed by computer system 700 in response to processor 702 executing one or more sequences of one or more instructions contained in memory 704. Such instructions may be read into memory 704 from another machine-readable medium, such as data storage device 706. Execution of the sequences of instructions contained in main memory 704 causes processor 702 to perform the process steps described herein (e.g., as in methods 300, 400, 500 and 600). One or more processors in a multi-processing arrangement may also be employed to execute the sequences of instructions contained in memory 704. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 700 includes servers and personal computer devices. A personal computing device and server are generally remote from each other and typically interact through a communication network. The relationship of client and server arises by virtue of computer programs running on the respective computers and having a client-server relationship to each other. Computer system 700 can be, for example, and without limitation, a desktop computer, laptop computer, or tablet computer. Computer system 700 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions or data to processor 702 for execution. Such a medium may take many forms, including, but not limited to, non-volatile media, volatile media, and transmission media. Non-volatile media include, for example, optical disks, magnetic disks, or flash memory, such as data storage device 706. Volatile media include dynamic memory, such as memory 704. Transmission media include coaxial cables, copper wire, and fiber optics, including the wires that comprise bus 708. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A computer-implemented method for converting real number modeling to a cycle-driven simulation interface file, comprising:
   verifying an input in a file that includes a real number modeling code for a circuit design;
   requesting a user input parameter;
   converting the file to a cycle-driven simulation interface file based on the user input parameter; and
   verifying the cycle-driven simulation interface file, wherein converting the file to a cycle-driven simulation interface file comprises:
      building a definitions file storing a width of at least one real number in the circuit design;
      selecting a real number modeling file from the circuit design; and
      for the real number modeling file:
         parsing the real number modeling file;
         building a header file associated with the real number modeling file; and
         building a compilation file associated with the cycle-driven simulation interface file.

2. The computer-implemented method of claim 1, further comprising compiling the cycle-driven simulation interface file with a system-C compiler.

3. The computer-implemented method of claim 1, further comprising converting the cycle-driven simulation interface file into a register-transfer level file suitable to perform a circuit emulation in a digital mixed signal environment.

4. The computer-implemented method of claim 1, wherein converting the file to a cycle-driven simulation interface file comprises converting a process block in the real number modeling file into a cycle-driven process block.

5. The computer-implemented method of claim 1, wherein converting the file to a cycle-driven simulation interface file comprises inspecting a process block in the file for a clock definition.

6. The computer-implemented method of claim 1, wherein converting the file to a cycle-driven simulation interface file comprises transferring a clock definition to a process block in a leaf at least one level above a current leaf for the process block in a database hierarchy when the clock definition occurs in the current leaf.

7. The computer-implemented method of claim 1, wherein converting the file to a cycle-driven simulation interface file comprises creating a sub-level beneath a current leaf for a process block when a clock definition of the process block occurs in the current leaf.

8. The computer-implemented method of claim 1, wherein converting the file to a cycle-driven simulation interface file comprises converting a time delay in the file into an interval having a predetermined number of clock cycles.

9. The computer-implemented method of claim 1, wherein converting the file to a cycle-driven simulation interface file comprises verifying that a signal in a sensitivity list for a process block in the cycle-driven simulation interface file is driven by a valid clock input.

10. The computer-implemented method of claim 1, wherein converting the file to a cycle-driven simulation interface file comprises converting a floating point real value to a fixed point real value, and selecting a bit width of the fixed point real value according to a desired accuracy of the cycle-driven simulation interface file.

11. A system, comprising:
a memory, storing computer code; and
at least one processor that executes the computer code to:
verify an input in a file that includes a real number modeling code for a circuit design;
request a user input parameter;
convert the file to a cycle-driven simulation interface file based on the user input parameter, including converting a time delay in the file into an interval having a predetermined number of clock cycles; and
verify the cycle-driven simulation interface file, wherein to convert the file to a cycle-driven simulation interface file comprises:
build a definitions file storing a width of at least one real number in the circuit design;
select a real number modeling file from the circuit design; and for the real number modeling file:
parse the real number modeling file;
build a header file associated with the real number modeling file; and
build a compilation file associated with the cycle-driven simulation interface file.

12. The system of claim 11, wherein the computer code further comprises commands causing the processor to compile the cycle-driven simulation interface file with a system-C compiler.

13. The system of claim 11, wherein the computer code further comprises commands causing the processor to convert the cycle-driven simulation interface file into a register-transfer level file suitable to perform a circuit emulation in a digital mixed signal environment.

14. The system of claim 11, wherein the computer code further comprises commands causing the processor convert a process block in the real number modeling file into a cycle-driven process block.

15. A non-transitory, computer-readable medium comprising instructions stored in a memory which, when executed by a processor cause a computer to perform a method comprising:
verifying an input in a file that includes a real number modeling code for a circuit design;
requesting a user input parameter;
converting the file to a cycle-driven simulation interface file based on the user input parameter, including converting a time delay in the file into an interval having a predetermined number of clock cycles and verifying that a signal in a sensitivity list for a process block in the cycle-driven simulation interface file is driven by a valid clock input; and
verifying the cycle-driven simulation interface file, wherein converting the file to a cycle-driven simulation interface file comprises:
building a definitions file storing a width of at least one real number in the circuit design;
selecting a real number modeling file from the circuit design; and for the real number modeling file:
parsing the real number modeling file;
building a header file associated with the real number modeling file; and
building a compilation file associated with the cycle-driven simulation interface file.

16. The non-transitory, computer-readable medium of claim 15, further comprising instructions for compiling the cycle-driven simulation interface file with a system-C compiler.

17. The non-transitory, computer-readable medium of claim 15, further comprising instructions for converting the cycle-driven simulation interface file into a register-transfer level file suitable to perform a circuit emulation in a digital mixed signal environment.

18. The non-transitory, computer-readable medium of claim 15, wherein the instructions for converting the file to a cycle-driven simulation interface file comprise instructions for converting a process block in the real number modeling file into a cycle-driven process block.

19. The non-transitory, computer-readable medium of claim 15, wherein the instructions for converting the file to a cycle-driven simulation interface file comprise instructions for inspecting a process block in the file for a clock definition.

20. The non-transitory, computer-readable medium of claim 15, wherein the instructions for converting the file to a cycle-driven simulation interface file comprise instructions for transferring a clock definition to a process block in a leaf at least one level above a current leaf for the process block in a database hierarchy when the clock definition occurs in the current leaf.

* * * * *